(12) United States Patent
Kim et al.

(10) Patent No.: US 8,610,475 B2
(45) Date of Patent: Dec. 17, 2013

(54) INTEGRATED CIRCUIT

(75) Inventors: Yong-Ju Kim, Gyeonggi-do (KR);
Seong-Jun Lee, Gyeonggi-do (KR);
Hae-Rang Choi, Gyeonggi-do (KR);
Jae-Min Jang, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 147 days.

(21) Appl. No.: 12/981,764

(22) Filed: Dec. 30, 2010

(65) Prior Publication Data
US 2012/0105119 A1      May 3, 2012

(30) Foreign Application Priority Data
Oct. 29, 2010 (KR) .................. 10-2010-0107129

(51) Int. Cl.
*H03L 7/06*      (2006.01)
(52) U.S. Cl.
USPC ............ 327/158; 327/147; 327/149; 327/156
(58) Field of Classification Search
USPC .............. 327/141, 144–163; 331/1/A, 15–17; 375/373–376
See application file for complete search history.

(56) References Cited

U.S. PATENT DOCUMENTS

| | | | |
|---|---|---|---|
| 7,633,324 B2 * | 12/2009 | Yun et al. | 327/160 |
| 7,915,939 B2 * | 3/2011 | Jang et al. | 327/175 |
| 2008/0056030 A1 * | 3/2008 | Cho | 365/194 |
| 2008/0164919 A1 * | 7/2008 | Kim et al. | 327/158 |
| 2008/0181348 A1 * | 7/2008 | Best et al. | 375/376 |
| 2009/0231006 A1 * | 9/2009 | Jang et al. | 327/175 |
| 2010/0156487 A1 * | 6/2010 | Kim | 327/158 |
| 2010/0156488 A1 * | 6/2010 | Kim et al. | 327/158 |

FOREIGN PATENT DOCUMENTS

| | | |
|---|---|---|
| KR | 1020090098531 | 9/2009 |
| KR | 1020100073427 | 7/2010 |

OTHER PUBLICATIONS

Preliminary Rejection issued by the Korean Intellectual Property Office on Nov. 28, 2012.

* cited by examiner

*Primary Examiner* — Lincoln Donovan
*Assistant Examiner* — Brandon S Cole
(74) *Attorney, Agent, or Firm* — IP & T Group LLP

(57) ABSTRACT

An integrated circuit includes a delay locked loop configured to delay a reference clock signal by a delay time for delay locking and generate a delay locked clock signal, a clock transmission circuit configured to transmit the delay locked clock signal in response to a clock transmission signal, a duty correction circuit configured to perform duty correction operation on an output clock signal of the clock transmission circuit, and a clock transmission signal generation circuit configured to generate the clock transmission signal in response to a command and burst length information.

15 Claims, 5 Drawing Sheets

INTEGRATED CIRCUIT

CROSS-REFERENCE TO RELATED APPLICATIONS

The present application claims priority of Korean Patent Application No. 10-2010-0107129, filed on Oct. 29, 2010, which is incorporated herein by reference in its entirety.

BACKGROUND OF THE INVENTION

Exemplary embodiments of the present invention relate to an integrated circuit, and more particularly, to a delay locked loop (DLL) of an integrated circuit.

In general, an integrated circuit such as a double data rate synchronous DRAM (DDR SDRAM) includes a delay locked loop (DLL) for allowing an internal clock signal and an external clock signal to have the same phase in order to compensate for time delay occurring in an internal circuit when using the external clock signal. In other words, the delay locked loop receives the external clock signal and compensates for a delay component of a clock path and a data path to reflect negative delay in advance, thereby allowing data outputted from the integrated circuit to be synchronized with the external clock signal.

Meanwhile, a clock signal may be distorted by noise and the like. In such a case, the duty cycle of the clock signal may be distorted. Then, the delay locked loop using such a clock signal is likely to perform an abnormal operation due to the clock signal with a distorted duty cycle, and the duty cycle of a clock signal outputted from the delay locked loop may also be distorted. In this regard, the semiconductor integrated circuit includes a duty correction circuit (DCC) in order to correct a change in the duty cycle of a clock signal, in addition to the delay locked loop.

FIG. 1 is a block diagram illustrating the configuration of a conventional integrated circuit.

Referring to FIG. 1, a conventional integrated circuit 100 includes an input buffer circuit 110, a delay locked loop 120, a duty correction circuit 130, and an output driver 140. The input buffer circuit 110 buffers an external clock signal EX_CLK inputted from the outside of the integrated circuit to output a reference clock signal REF_CLK. The delay locked loop 120 delays the reference clock signal REF_CLK by a delay time for delay locking to generate a delay locked clock signal DLL_CLK. The duty correction circuit 130 receives the delay locked clock signal DLL_CLK outputted from the delay locked loop 120 and performs a duty correction operation. The output driver 140 outputs inputted data DATA to a pad DQ in synchronization with an internal clock signal IN_CLK with a duty cycle corrected by the duty correction circuit 130.

Hereinafter, the operation of the integrated circuit 100 having the above configuration will be described.

The input buffer circuit 110 buffers the external clock signal EX_CLK to transfer a buffered signal to the delay locked loop 120 as the reference clock signal REF_CLK.

The delay locked loop 120 delays the reference clock signal REF_CLK by reflecting a delay time of a clock path and a data path of the integrated circuit, e.g., delay times occurring in the input buffer circuit 110 and the output driver 140, and outputs the delay locked clock signal DLL_CLK.

The duty correction circuit 130 adjusts a clock edge of the delay locked clock signal DLL_CLK outputted from the delay locked loop 120 and generates the internal clock signal IN_CLK with a constant duty cycle ratio of 50:50.

The output driver 140 outputs the inputted data DATA to the pad DQ in synchronization with the internal clock signal IN_CLK with the duty cycle corrected by the duty correction circuit 130.

The conventional integrated circuit 100 has the following features.

When the delay locked loop 120 is in an enabled state, the duty correction circuit 130 is also in an enabled state, continuously receives the delay locked clock signal DLL_CLK to perform the duty correction operation, and outputs the internal clock signal IN_CLK with a corrected duty cycle, since the external clock signal EX_CLK is continuously inputted. However, since the internal clock signal IN_CLK is used only for a specific operation such as a read operation, the conventional integrated circuit 100 may use a large amount of current.

SUMMARY OF THE INVENTION

An embodiment of the present invention is directed to provide an integrated circuit capable of minimizing current consumption when generating an internal clock signal.

In accordance with an exemplary embodiment of the present invention, an integrated circuit includes: a delay locked loop configured to delay a reference clock signal by a delay time for delay locking and generate a delay locked clock signal; a clock transmission circuit configured to transmit the delay locked clock signal in response to a clock transmission signal; a duty correction circuit configured to perform a duty correction operation on an output clock signal of the clock transmission circuit; and a clock transmission signal generation circuit configured to generate the clock transmission signal in response to a command and burst length information.

DESCRIPTION OF SPECIFIC EMBODIMENTS

Figure 1:
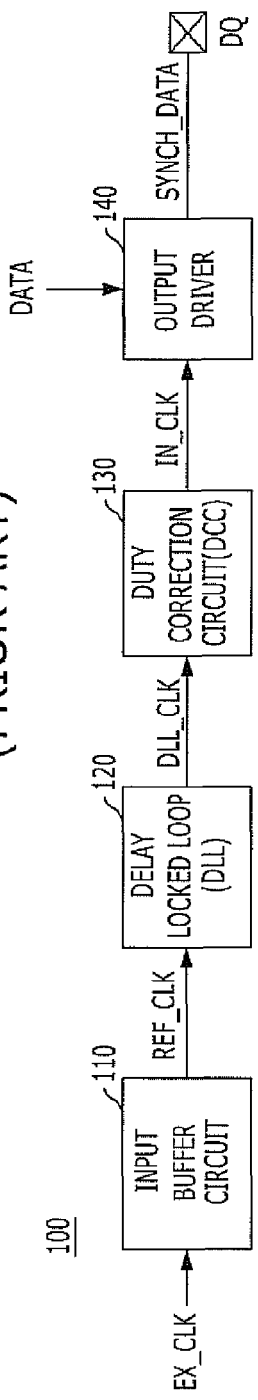
FIG. 1 is a block diagram illustrating the configuration of a conventional integrated circuit.

Exemplary embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

Figure 2:
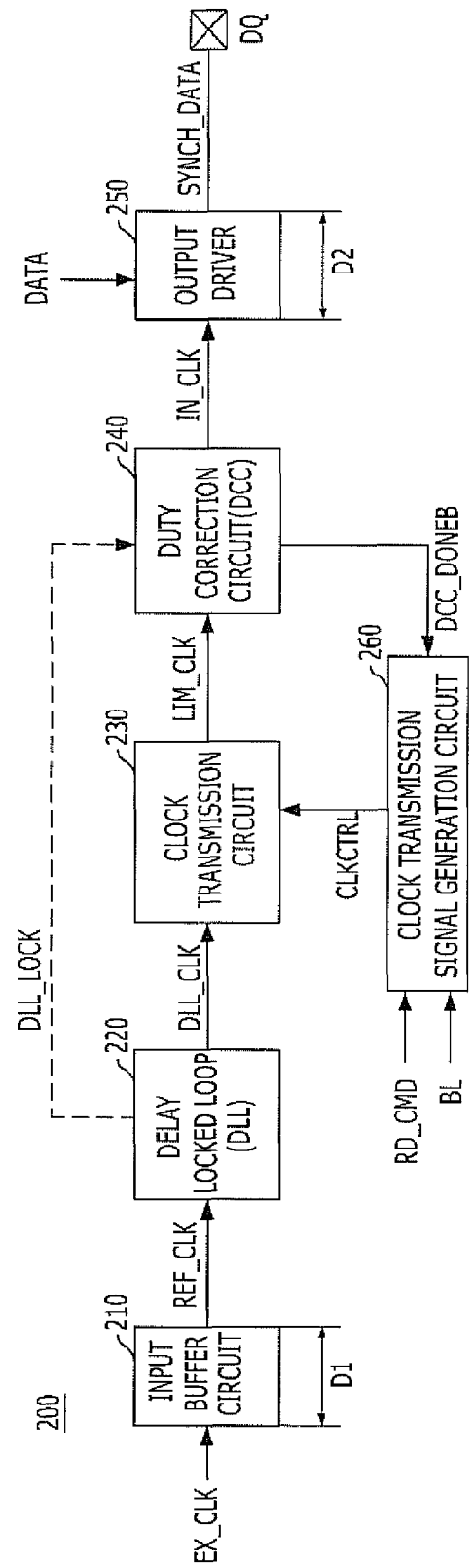
FIG. 2 is a block diagram illustrating the configuration of an integrated circuit in accordance with an embodiment of the present invention.
Figure 3:
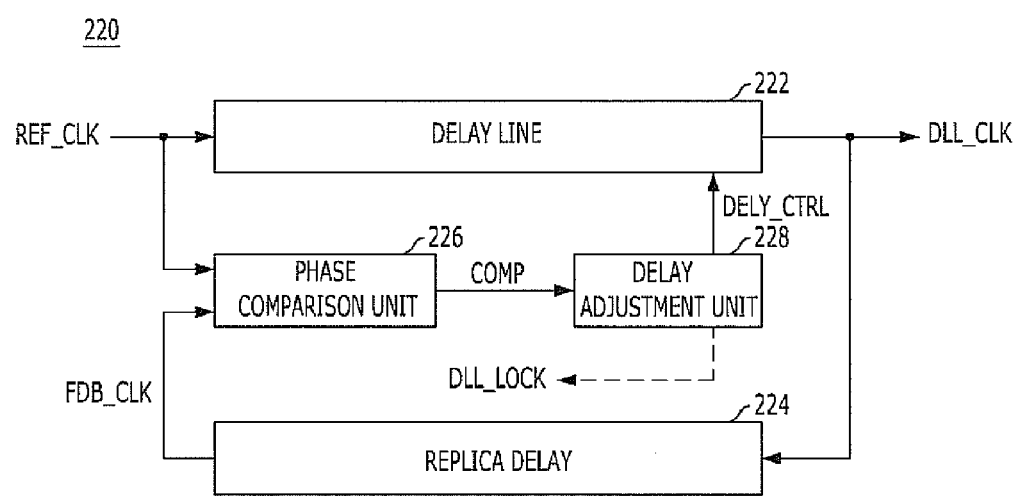
FIG. 3 is a block diagram illustrating the internal configuration of a delay locked loop illustrated in FIG. 2.
Figure 4:
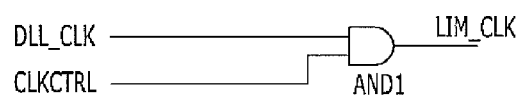
FIG. 4 is a circuit diagram illustrating the internal configuration of a clock transmission circuit illustrated in FIG. 2.
Figure 5:
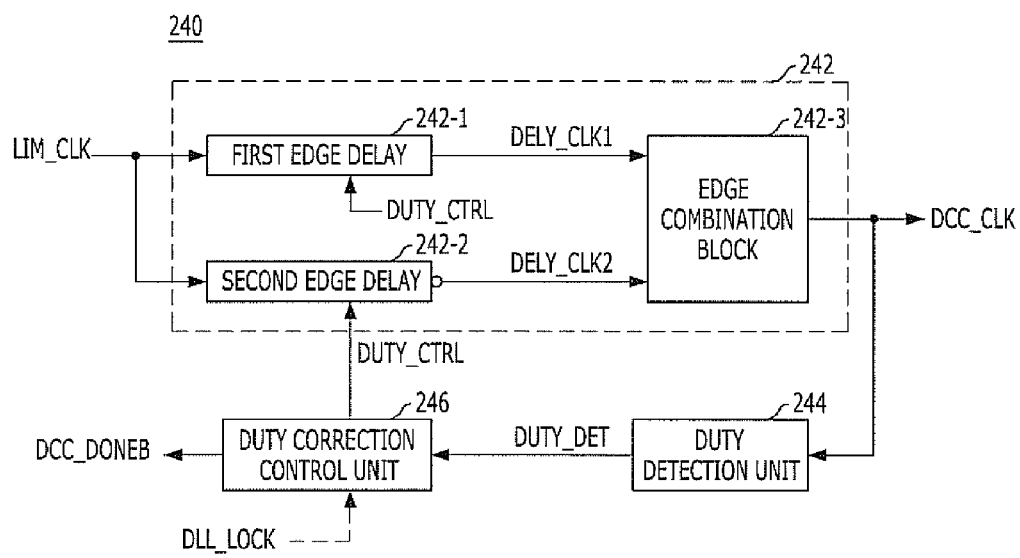
FIG. 5 is a block diagram illustrating the internal configuration of a duty correction circuit illustrated in FIG. 2.
Figure 6:
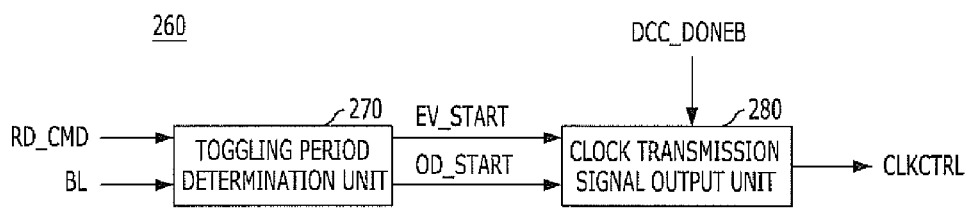
FIG. 6 is a block diagram illustrating the internal configuration of a clock transmission signal generation circuit illustrated in FIG. 2.
Figure 7A:
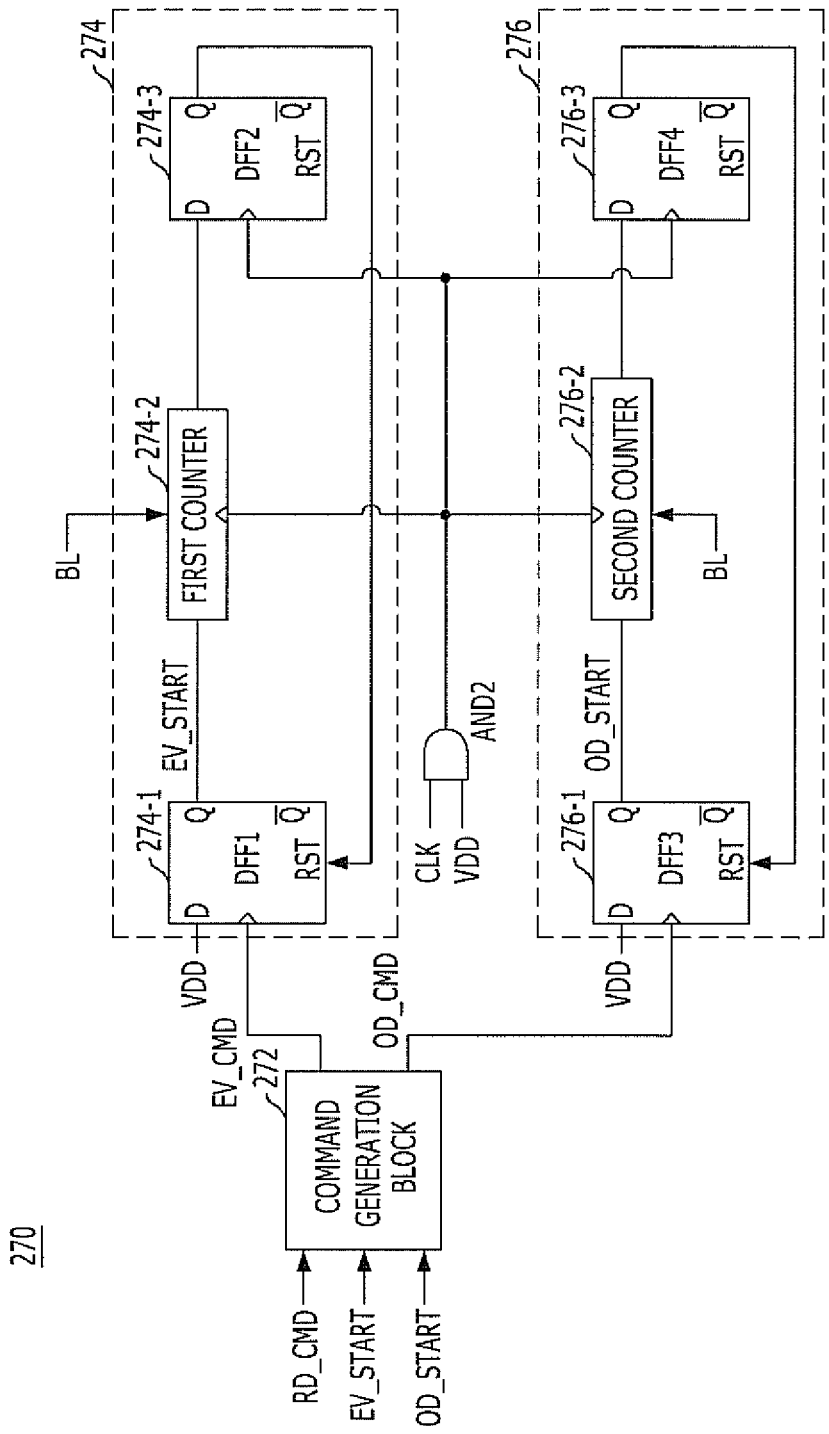
FIG. 7A is a block diagram illustrating the internal configuration of a toggling period determination circuit illustrated in FIG. 6.
Figure 7B:
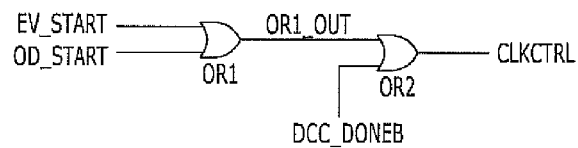
FIG. 7B is a circuit diagram illustrating the internal configuration of a clock transmission signal output circuit illustrated in FIG. 6.

FIG. 2 is a block diagram illustrating the configuration of an integrated circuit in accordance with an embodiment of the present invention, FIG. 3 is a block diagram illustrating the internal configuration of a delay locked loop (DLL) illustrated in FIG. 2, FIG. 4 is a circuit diagram illustrating the internal configuration of a clock transmission circuit illustrated in FIG. 2, FIG. 5 is a block diagram illustrating the internal configuration of a duty correction circuit (DCC) illustrated in FIG. 2, FIG. 6 is a block diagram illustrating the internal configuration of a clock transmission signal generation circuit illustrated in FIG. 2, FIG. 7A is a block diagram illustrating the internal configuration of a toggling period determination circuit illustrated in FIG. 6, and FIG. 7B is a circuit diagram illustrating the internal configuration of a clock transmission signal output circuit illustrated in FIG. 6.

Referring to FIG. 2, an integrated circuit 200 includes an input buffer circuit 210, a delay locked loop 220, a clock transmission circuit 230, a duty correction circuit 240, an output driver 250, and a clock transmission signal generation circuit 260.

The input buffer circuit 210 is configured to buffer an external clock signal EX_CLK inputted from the outside of the integrated circuit to output a reference clock signal REF_CLK. The delay locked loop 220 is configured to delay the reference clock signal REF_CLK by a delay time D1+D2 for delay locking and generate a delay locked clock signal DLL_CLK. The clock transmission circuit 230 is configured to transmit the delay locked clock signal DLL_CLK in response to a clock transmission signal CLKCTRL.

The duty correction circuit 240 is configured to receive an output clock signal LIM_CLK of the clock transmission circuit 230 to perform a duty correction operation, and output a duty correction completion signal DCC_DONEB after completing the duty correction for the output clock signal LIM_CLK of the clock transmission circuit 230. The output driver 250 is configured to output data DATA to a pad DQ in synchronization with an internal clock signal IN_CLK with a duty cycle corrected by the duty correction circuit 240. The clock transmission signal generation circuit 260 is configured to generate the clock transmission signal CLKCTRL according to a read command RD_CMD and burst length information BL.

As illustrated in FIG. 3, the delay locked loop 220 includes a delay line 222, a replica delay 224, a phase comparison unit 226, and a delay adjustment unit 228. The delay line 222 is configured to delay the reference clock signal REF_CLK by the delay time D1+D2 for delay locking in response to a delay adjustment signal DELY_CTRL and output the delay locked clock signal DLL_CLK. The replica delay 224 is configured to delay the delay locked clock signal DLL_CLK by using a modeled delay, in which an input/output path delay of the delay locked loop is reflected, and output a feedback clock signal FDB_CLK. The phase comparison unit 226 is configured to compare a phase of the reference clock signal REF_CLK with a phase of the feedback clock signal FDB_CLK. The delay adjustment unit 228 is configured to generate the delay adjustment signal DELY_CTRL in response to an output signal COMP of the phase comparison unit 226. The delay adjustment unit 228 may output a delay locking information signal DLL_LOCK in response to the output signal COMP of the phase comparison unit 226, and the delay locking information signal DLL_LOCK includes information regarding whether delay locking is achieved.

As illustrated in FIG. 4, the clock transmission circuit 230 includes an AND gate AND1 configured to perform an AND operation on the delay locked clock signal DLL_CLK and the clock transmission signal CLKCTRL.

As illustrated in FIG. 5, the duty correction circuit 240 includes a duty correction unit 242, a duty detection unit 244, and a duty correction control unit 246. The duty correction unit 242 is configured to correct the duty cycle of the output clock signal LIM_CLK of the clock transmission circuit 230 toggling within a limited period in response to a duty correction signal DUTY_CTRL. The duty detection unit 244 is configured to detect the duty cycle of the internal clock signal IN_CLK, which is corrected by the duty correction unit 242. The duty correction control unit 246 is configured to output the duty correction signal DUTY_CTRL and the duty correction completion signal DCC_DONEB in response to a duty detection signal DUTY_DET outputted from the duty detection unit 244. The duty correction control unit 246 may be enabled in response to the delay locking information signal DLL_LOCK outputted from the delay adjustment unit 228 of the delay locked loop 220. That is, the duty correction control unit 246 is enabled only when delay locking of the delay locked loop 220 is completed. Meanwhile, the duty correction unit 242 includes a first edge delay 242_1, a second edge delay 242_2, and an edge combination block 242_3. The first edge delay 242_1 is configured to delay the rising edge of the output clock signal LIM_CLK of the clock transmission circuit 230 by a predetermined delay in response to the duty correction signal DUTY_CTRL and output a first delayed clock signal DELY_CLK1. The second edge delay 242_2 is configured to delay the falling edge of the output clock signal LIM_CLK of the clock transmission circuit 230 by a predetermined delay in response to the duty correction signal DUTY_CTRL and output a second delayed clock signal DELY_CLK2. The edge combination block 242_3 is configured to combine the first delayed clock signal DELY_CLK1 with the second delayed clock signal DELY_CLK2, and output the internal clock signal IN_CLK with the corrected duty cycle.

As illustrated in FIG. 6, the clock transmission signal generation circuit 260 includes a toggling period determination unit 270 and a clock transmission signal output unit 280. The toggling period determination unit 270 is configured to extend the pulse width of the read command RD_CMD in response to the burse length information BL. The clock transmission signal output unit 280 is configured to output the clock transmission signal CLKCTRL in response to first and second output signals EV_START and OD_START of the toggling period determination unit 270 and the duty correction completion signal DCC_DONEB. The toggling period determination unit 270 and the clock transmission signal output unit 280 are illustrated in FIGS. 7A and 7B, respectively.

Referring to FIG. 7A, the toggling period determination unit 270 includes a command generation block 272, a first pulse signal generation block 274, and a second pulse signal generation block 276. In response to a series of the read commands RD_CMD, the command generation block 272 generates a first command EV_CMD corresponding to an odd-numbered one of the read command RD_CMD and the first pulse signal EV_START, and a second command OD_CMD corresponding to an even-numbered one of the read command RD_CMD and the second pulse signal OD_START. The first pulse signal generation block 274 is configured to generate the first pulse signal EV_START having a pulse width corresponding to the burse length information in response to the first command EV_CMD. The second pulse signal generation block 276 is configured to generate the second pulse signal OD_START having a pulse width corresponding to the burse length information in response to the second command OD_CMD.

The first pulse signal generation block 274 includes a first pulse signal output part 274_1, a first counter 274_2, and a first reset signal output part 274_3. The first pulse signal output part 274_1 is configured to output the first pulse signal EV_START in response to the first command EV_CMD and a first reset signal RST1. The first counter 274_2 is configured to count the first pulse signal EV_START in response to the burse length information. The first reset signal output part 274_3 is configured to output the first reset signal RST1 in response to an output signal of the first counter 274_2. The first pulse signal output part 274_1 includes a first D flip-flop DFF1 that receives a high power supply voltage VDD to output an input signal (i.e., VDD) in synchronization with the first command EV_CMD and is reset in response to the first reset signal RST1. The first reset signal output part 274_3 includes a second D flip-flop DFF2 that receives the output signal of the first counter 274_2 as an input signal to output the input signal in synchronization with a clock signal CLK.

The second pulse signal generation block 276 includes a second pulse signal output part 276_1, a second counter 276_2, and a second reset signal output part 276_3. The second pulse signal output part 276_1 is configured to output the second pulse signal OD_START in response to the second command OD_CMD and a second reset signal RST2. The second counter 276_2 is configured to count the second pulse signal OD_START in response to the burse length information. The second reset signal output part 276_3 is configured to output the second reset signal RST2 in response to an output signal of the second counter 276_2. The second pulse signal output part 276_1 includes a third D flip-flop DFF3 that receives the high power supply voltage VDD to output an input signal (i.e., VDD) in synchronization with the second command OD_CMD and is reset in response to the second reset signal RST2. The second reset signal output part 276_3 includes a fourth D flip-flop DFF4 that receives the output signal of the second counter 276_2 as an input signal to output the input signal in synchronization with the clock signal CLK.

Referring to FIG. 7b, the clock transmission signal output unit 280 includes a first OR gate OR1 and a second OR gate OR2. The first OR gate OR1 is configured to receive the first pulse signal EV_START and the second pulse signal OD_START and perform an OR operation on the received signals. The second OR gate OR2 is configured to receive an output signal OR1_OUT of the first OR gate OR1 and the duty correction completion signal DCC_DONEB and perform an OR operation on the received signals to output the clock transmission signal CLKCTRL.

Hereinafter, the operation of the integrated circuit 200 having the above configuration in accordance with an embodiment of the invention will be described with reference to FIG. 8.

Figure 8:
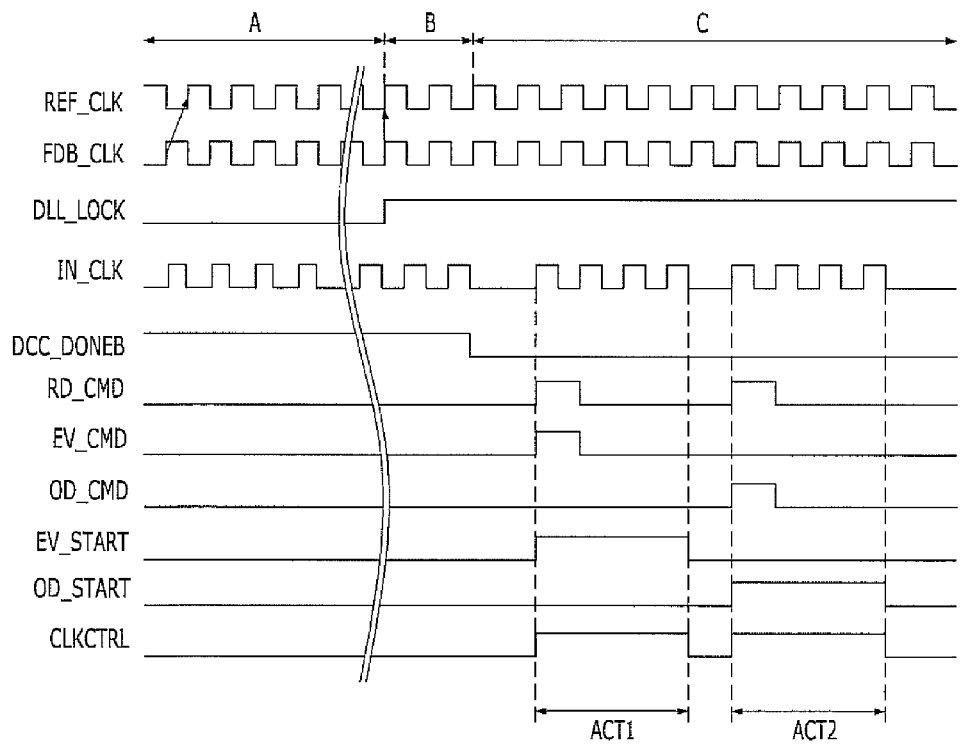
FIG. 8 is a timing diagram explaining the operation of the integrated circuit illustrated in FIG. 2.

Referring to FIG. 8, the integrated circuit 200 performs a delay locking process A, a duty correction process B, and a toggling period limitation process C.

The delay locking process A is as follows. The delay locked loop 220 delays the reference clock signal REF_CLK by the delay time D1+D2 for delay locking and generates the delay locked clock signal (DLL_CLK, not shown). This represents that the phase of the reference clock signal REF_CLK is synchronized with the phase of the feedback clock signal FDB_CLK. The delay locked clock signal (DLL_CLK, not shown) generated by the delay locked loop 220 as described above is inputted to the duty correction circuit 240 as the output clock LIM_CLK of the clock transmission circuit 230. The delay locked loop 220 deactivates the delay locking information signal DLL_LOCK to a logic low level to output the deactivated signal during the delay locking process A, and then activates the delay locking information signal DLL_LOCK to a logic high level after the delay locking process A is completed, that is, after the phase of the reference clock signal REF_CLK is synchronized with the phase of the feedback clock signal FDB_CLK.

The duty correction process B will be described below. The duty correction circuit 240 corrects the duty cycle of the output clock signal (LIM_CLK, not shown) of the clock transmission circuit 230 in response to the delay locking information signal DLL_LOCK activated to the logic high level, and then activates the duty correction completion signal DCC_DONEB to a logic low level when the output clock signal (LIM_CLK, not shown) of the clock transmission circuit 230 has a constant duty cycle ratio of 50:50.

The toggling period limitation process C will be described below. The clock transmission circuit 230 transmits the delay locked clock signal (DLL_CLK, not shown) to the duty correction circuit 240 only for activation periods ACT1 and ACT2 of the clock transmission signal CLKCTRL when the duty correction completion signal DCC_DONEB is activated to the logic low level. At this time, the clock transmission signal CLKCTRL is a signal obtained by extending the pulse width of the read command RD_COM in correspondence with the burst length information. In more detail, the first pulse signal EV_START and the second pulse signal OD_START are generated by extending the first command EV_CMD corresponding to the odd-numbered read command and the second command OD_CMD corresponding to the even-numbered read command, respectively. Then, an OR operation is performed on the first pulse signal EV_START and the second pulse signal OD_START, so that the clock transmission signal CLKCTRL is generated.

Consequently, in the period after the duty correction is completed, that is, in the period C while the duty correction completion signal DCC_DONEB is activated, since the duty correction circuit 240 receives the output clock signal LIM_CLK of the clock transmission circuit 230 and outputs the internal clock signal IN_CLK with the corrected duty cycle only for the activation periods ACT1 and ACT2 of the clock transmission signal CLKCTRL, current consumption can be minimized.

In accordance with the embodiment of the invention as described above, a clock signal inputted to the duty correction circuit is limited to toggle within a period corresponding to a read operation, so that a current consumed by the duty correction circuit can be minimized.

In accordance with the embodiment of the invention, a toggling period of a delay locked clock signal outputted from a delay locked loop is limited to a predetermined period, so that a current consumed by a duty correction circuit is minimized. Consequently, the total current consumption of an integrated circuit is reduced.

While the present invention has been described with respect to the specific embodiments, it will be apparent to those skilled in the art that various changes and modifications may be made without departing from the spirit and scope of the invention as defined in the following claims.

What is claimed is:

1. An integrated circuit comprising:
   a delay locked loop configured to delay a reference clock signal by a delay time for delay locking and generate a delay locked clock signal;
   a clock transmission circuit configured to transmit the delay locked clock signal in response to a clock transmission signal;
   a duty correction circuit configured to perform a duty correction operation on an output clock signal of the clock transmission circuit; and
   a clock transmission signal generation circuit configured to generate the clock transmission signal in response to a read command and burst length information,
   wherein the clock transmission signal generation circuit is configured to generate the clock transmission signal by extending a pulse width of the read command to a length in response to the burst length information.

2. The integrated circuit of claim 1, further comprising:
   an input buffer circuit configured to buffer an external clock signal and output the reference clock signal; and
   an output driver configured to output data by using a duty corrected clock signal outputted from the duty correction circuit.

3. The integrated circuit of claim 1, wherein the delay locked loop comprises:
   a delay line configured to delay the reference clock signal by the delay time for the delay locking in response to a delay adjustment signal and output the delay locked clock signal;
   a replica delay configured to delay the delay locked clock signal by using a modeled delay, in which an input/output path delay of the delay locked loop is reflected, and output a feedback clock signal;
   a phase comparison unit configured to compare a phase of the reference clock signal with a phase of the feedback clock signal; and
   a delay adjustment unit configured to generate the delay adjustment signal in response to an output signal of the phase comparison unit.

4. The integrated circuit of claim 3, wherein the delay adjustment unit is configured to output a delay locking information signal in response to the output signal of the phase comparison unit.

5. The integrated circuit of claim 4, wherein the duty correction circuit comprises:
   a duty correction unit configured to correct a duty cycle of the clock signal in response to a duty correction signal;
   a duty detection unit configured to detect a duty cycle of an output signal of the duty correction unit; and
   a duty correction control unit configured to be enabled in response to the delay locking information signal and output the duty correction signal in response to a duty detection signal outputted from the duty detection unit.

6. The integrated circuit of claim 5, wherein the duty correction unit comprises:
   a first edge delay configured to delay a rising edge of the clock signal by a predetermined delay in response to the duty correction signal and output a first delayed clock signal;
   a second edge delay configured to delay a falling edge of the clock signal by a predetermined delay in response to the duty correction signal and output a second delayed clock signal; and
   an edge combination block configured to combine the first delayed clock signal with the second delayed clock signal, and output a duty corrected clock signal with a corrected duty cycle.

7. The integrated circuit of claim 1, wherein the duty correction circuit comprises:
   a duty correction unit configured to correct a duty cycle of the clock signal in response to a duty correction signal;
   a duty detection unit configured to detect a duty cycle of an output signal of the duty correction unit; and
   a duty correction control unit configured to output the duty correction signal in response to a duty detection signal outputted from the duty detection unit.

8. The integrated circuit of claim 7, wherein the duty correction unit comprises:
   a first edge delay configured to delay a rising edge of the clock signal by a predetermined delay in response to the duty correction signal and output a first delayed clock signal;
   a second edge delay configured to delay a falling edge of the clock signal by a predetermined delay in response to the duty correction signal and output a second delayed clock signal; and
   an edge combination block configured to combine the first delayed clock signal with the second delayed clock signal, and output a duty corrected clock signal with a corrected duty cycle.

9. The integrated circuit of claim 7, wherein the duty correction control unit is configured to output a duty correction completion signal, which indicates that the duty correction has been completed for the output clock signal of the clock transmission circuit, in response to the duty detection signal.

10. The integrated circuit of claim 1, wherein the clock transmission signal generation circuit comprises:
    a command generation block configured to, when the command is inputted in series, generate a first command corresponding to an odd-numbered one of the command in response to the command and a first pulse signal, and a second command corresponding to an even-numbered one of the command in response to the command and a second pulse signal;
    a first pulse signal generation block configured to generate the first pulse signal having a pulse width corresponding to the burse length information in response to the first command;
    a second pulse signal generation block configured to generate the second pulse signal having a pulse width corresponding to the burse length information in response to the second command; and
    a clock transmission signal output unit configured to output the clock transmission signal in response to the first pulse signal and the second pulse signal.

11. The integrated circuit of claim 10, wherein the first pulse signal generation block comprises:
    a first pulse signal output part configured to output the first pulse signal in response to the first command and a reset signal;
    a counter configured to count the first pulse signal in response to the burse length information; and
    a reset signal output part configured to output the reset signal in response to an output signal of the counter.

12. The integrated circuit of claim 11, wherein the first pulse signal output part comprises:
    a first D flip-flop configured to receive a predetermined power supply voltage as an input signal to output the input signal in synchronization with the first command and be reset in response to the reset signal, and wherein the reset signal output part comprises:
a second D flip-flop configured to receive the output signal of the counter as an input signal to output the input signal in synchronization with a clock signal.

13. The integrated circuit of claim 10, wherein the second pulse signal generation block comprises:
a second pulse signal output part configured to output the second pulse signal in response to the second command and a reset signal;
a counter configured to count the second pulse signal in response to the burse length information; and
a reset signal output part configured to output the reset signal in response to an output signal of the counter.

14. The integrated circuit of claim 13, wherein the second pulse signal output part comprises:
a first D flip-flop configured to receive a predetermined power supply voltage as an input signal to output the input signal in synchronization with the second command and be reset in response to the reset signal; and
wherein the reset signal output part comprises:
a second D flip-flop configured to receive the output signal of the counter as an input signal to output the input signal in synchronization with a clock signal.

15. The integrated circuit of claim 1, wherein a toggling period of the output clock signal of the clock transmission circuit is limited within a period corresponding to a read operation.

* * * * *